US011650635B2

(12) United States Patent
Kazama et al.

(10) Patent No.: US 11,650,635 B2
(45) Date of Patent: May 16, 2023

(54) IMAGE DISPLAY DEVICE

(71) Applicant: Panasonic Intellectual Property Management Co., Ltd., Osaka (JP)

(72) Inventors: Masato Kazama, Osaka (JP); Jun Araya, Osaka (JP); Ryouji Oonishi, Osaka (JP); Tadahiro Kugimaru, Osaka (JP); Kazuyuki Takahashi, Shiga (JP); Kenji Mochidome, Osaka (JP); Kouji Terawaki, Osaka (JP)

(73) Assignee: PANASONIC INTELLECTUAL PROPERTY MANAGEMENT CO., LTD, Osaka (JP)

( * ) Notice: Subject to any disclaimer, the term of this patent is extended or adjusted under 35 U.S.C. 154(b) by 199 days.

(21) Appl. No.: 16/754,697

(22) PCT Filed: Jun. 17, 2019

(86) PCT No.: PCT/JP2019/023795
§ 371 (c)(1),
(2) Date: Apr. 8, 2020

(87) PCT Pub. No.: WO2020/017210
PCT Pub. Date: Jan. 23, 2020

(65) Prior Publication Data
US 2021/0165469 A1 Jun. 3, 2021

(30) Foreign Application Priority Data

Jul. 20, 2018 (JP) .............................. JP2018-137132

(51) Int. Cl.
*G06F 1/18* (2006.01)
*G09F 9/33* (2006.01)
*H04N 5/64* (2006.01)

(52) U.S. Cl.
CPC .............. *G06F 1/183* (2013.01); *G06F 1/182* (2013.01); *G09F 9/33* (2013.01); *H04N 5/64* (2013.01)

(58) Field of Classification Search
CPC .................................................... H05K 5/0274
See application file for complete search history.

(56) References Cited

U.S. PATENT DOCUMENTS

2009/0135096 A1* 5/2009 Jeong ................... H05K 5/0247
345/60
2010/0315570 A1* 12/2010 Mathew ............... H05K 5/0017
257/E27.111

(Continued)

FOREIGN PATENT DOCUMENTS

JP  63-120286 U  8/1988
JP  2009-128898 A  6/2009

(Continued)

OTHER PUBLICATIONS

International Search Report issued in corresponding International Patent Application No. PCT/JP2019/023795, dated Aug. 6, 2019, with English translation.

*Primary Examiner* — Jerry Wu
(74) *Attorney, Agent, or Firm* — McDermott Will & Emery LLP

(57) ABSTRACT

An image display device includes a display panel which displays an image, a back cover disposed along the back surface of the display panel, a circuit substrate which is disposed on the back surface of the back cover and which is for driving the display of the image on the display panel, and a FPC which connects the circuit substrate and the display panel. The back cover has a recess recessed inward from the edge of the back cover in a plan view. The FPC is disposed so as to pass through the recess.

12 Claims, 10 Drawing Sheets

(56) References Cited

U.S. PATENT DOCUMENTS

2014/0226080 A1* 8/2014 Tomomasa ............. H04N 5/645
                                                        348/794
2015/0277179 A1   10/2015 Nishi et al.

FOREIGN PATENT DOCUMENTS

| JP | 2013-195510 A | 9/2013 |
| JP | 2014-071368 A | 4/2014 |
| JP | 2015-026038 A | 2/2015 |
| JP | 2015-194543 A | 11/2015 |
| JP | 2015-219406 A | 12/2015 |

* cited by examiner

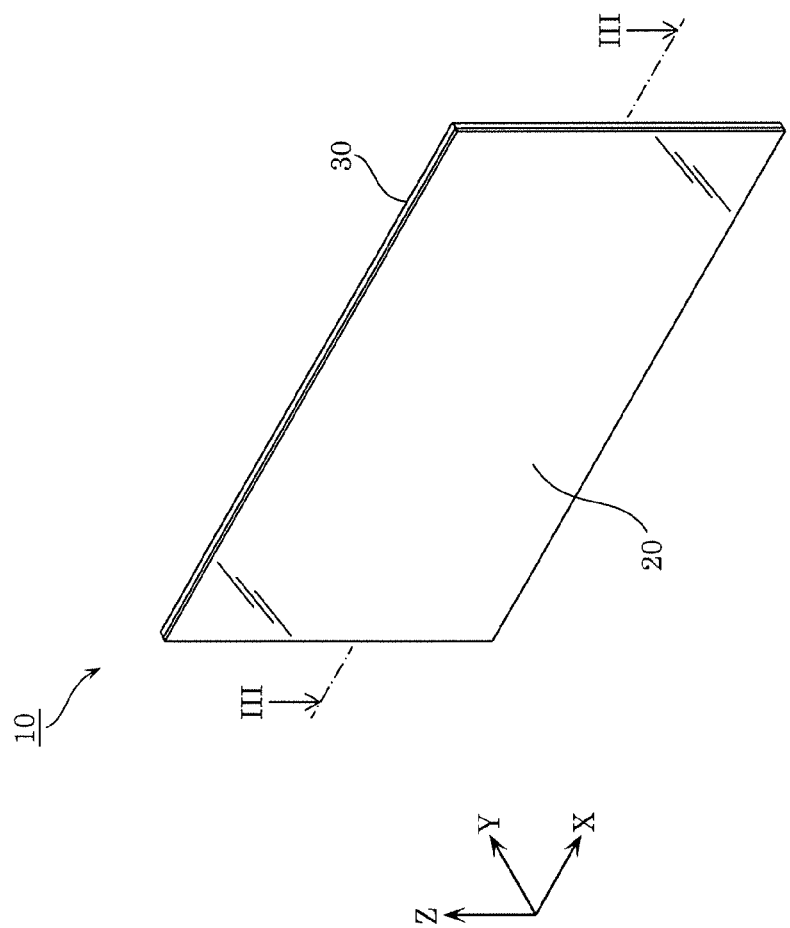

IMAGE DISPLAY DEVICE

CROSS-REFERENCE OF RELATED APPLICATIONS

This application is the U.S. National Phase under 35 U.S.C. § 371 of International Patent Application No. PCT/JP2019/023795, filed on Jun. 17, 2019, which in turn claims the benefit of Japanese Application No. 2018-137132, filed on Jul. 20, 2018, the entire disclosures of which Applications are incorporated by reference herein.

TECHNICAL FIELD

The present disclosure relates to an image display device including a display panel which displays an image.

BACKGROUND ART

Patent Literature (PTL) 1 discloses a display device which includes a display panel and a backlight chassis which holds the display panel. The display device includes a source substrate in the lowest side portion of the 15 backlight chassis. The source substrate is a substrate on which a plurality of source line drive circuits (source drivers) are mounted.

CITATION LIST

Patent Literature

PTL 1: Japanese Unexamined Patent Application Publication No. 2014-71368

SUMMARY OF THE INVENTION

Technical Problem

The present disclosure provides an image display device capable of increasing the quality of a displayed image and reducing the thickness of the image display device.

Solution to Problem

An image display device according to the present disclosure includes: a display panel which displays an image; a back cover disposed along a back surface of the display panel; a drive circuit substrate disposed on a back surface of the back cover, the circuit substrate being for driving a display of the image on the display panel; and a wiring member which connects the circuit substrate and the display panel. The back cover has a recess which is recessed inward from an edge of the back cover in a plan view, and the wiring member is disposed so as to pass through the recess.

Advantageous Effects of Invention

The image display device according to the present disclosure is capable of increasing the quality of a displayed image and reducing the thickness of the image display device.

BRIEF DESCRIPTION OF DRAWINGS

FIG. 1 is an external perspective view of an image display device according to an embodiment.

DESCRIPTION OF EXEMPLARY EMBODIMENTS

Figure 2A:
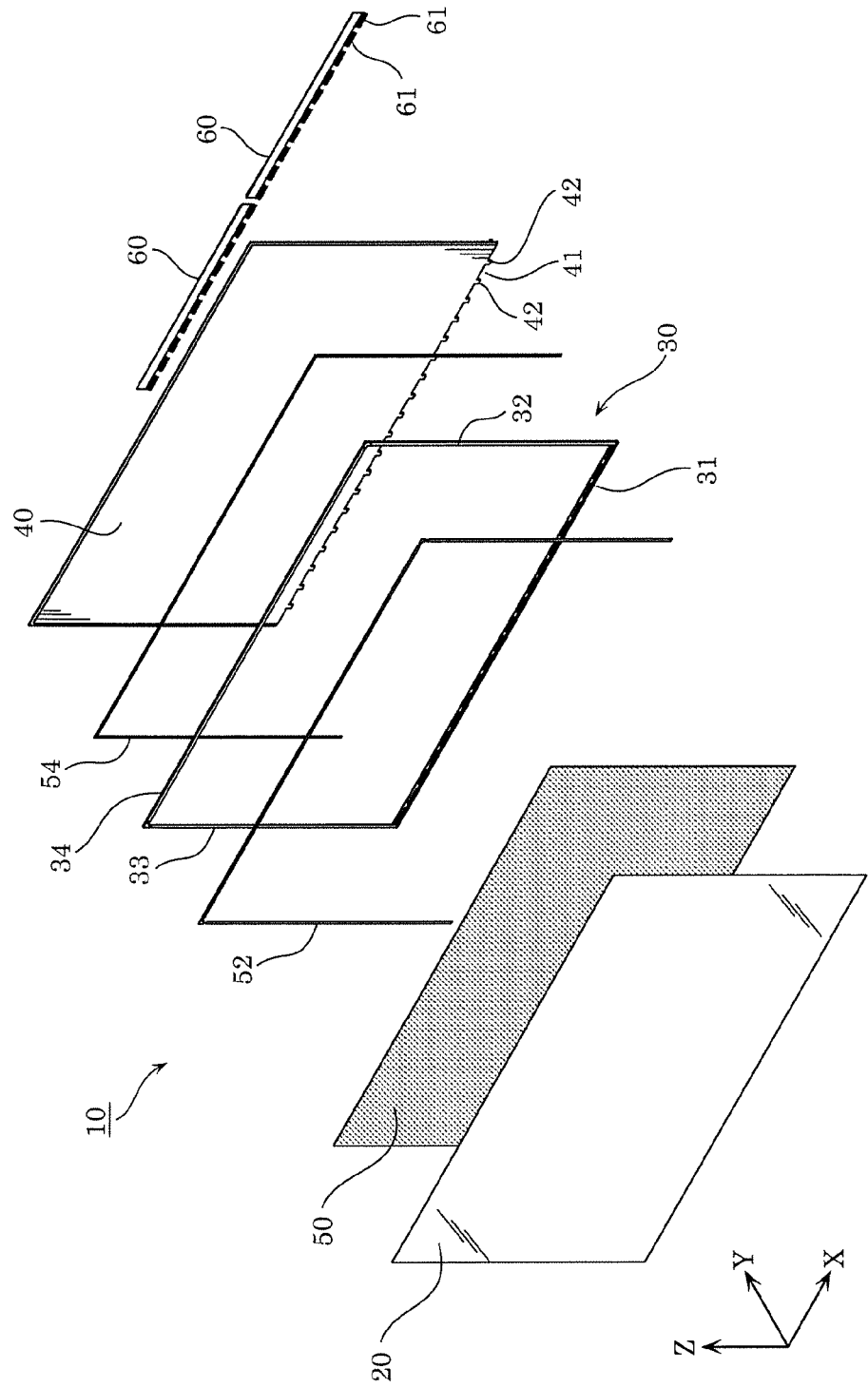
FIG. 2A is a first exploded perspective view of the image display device according to the embodiment.

The inventors of the present application identified the following problems related to a conventional image display device. For example, a conventional television receiver is known which includes a display panel (organic electroluminescent (EL) panel) with organic light-emitting diodes (OLEDs).

The organic EL panel is a self-emitting display panel which does not require a backlight unit unlike a liquid crystal panel. Accordingly, the thickness and the size of a display panel module including the organic EL panel can be reduced compared with a display panel module including the liquid crystal panel.

Moreover, in order to further reduce the thickness of the display panel module including the organic EL panel, the display panel module can be configured, for example, such that a drive circuit substrate which drives the display of an image on the organic EL panel is disposed on the back surface of the organic EL panel. Specifically, the bottom end portion of the heat dissipating metal plate disposed along the back surface of the organic EL panel is eliminated so that the drive circuit substrate is disposed on the portion of the back surface of the organic EL panel thus exposed.

With this configuration, while the thickness of the display panel module is reduced, the heat dissipation properties of the bottom end portion of the organic EL panel is reduced. Accordingly, the OLED elements may degrade (temperature degradation) at the bottom end portion due to a rise in temperature. In this case, at the bottom end portion, problems occur which lead to a reduced quality in displayed image, such as reduced luminance due to temperature degradation or reduced contrast due to reduced luminance.

In contrast, in the case where a metal plate is disposed along the entire back surface of the organic EL panel and the drive circuit substrate is disposed on the back surface of the metal plate, the heat dissipation properties of the organic EL panel increases. However, how to arrange flexible printed circuits (FPCs) which are wiring members which connect the drive circuit substrate and the organic EL panel is problematic. Specifically, each FPC includes a drive integrated circuit (IC) which transmits various kinds of signals to the organic EL panel, for example. The drive IC generates heat when driven. Accordingly, in view of reduction in thickness of the display panel module and suppression in temperature degradation, how to arrange the FPCs is an important issue.

The present disclosure has been conceived based on such finding. As a result of intensive studies by the inventors of the present application, the inventors have arrived at an idea of an image display device which is capable of increasing the quality of a displayed image and reducing the thickness of the image display device.

Hereinafter, an embodiment (including its variations) will be described with reference to the drawings as necessary. Note that unnecessarily detailed descriptions may be omitted. For example, detailed descriptions of already known matters and overlapping description of substantially the same configuration may be omitted. This is to avoid the following description to become unnecessarily redundant, and to facilitate understanding of the person skilled in the art.

The inventors of the present application provide the accompanying drawings and the following description so that the person skilled in the art fully understands the present disclosure, and do not intend to limit the subject matter of the claims by this.

Moreover, in the following embodiment and variations, the top-bottom direction is represented by a Z-axis, the front-back direction is represented by a Y-axis, and the left-right direction is represented by an X-axis for the sake of description, but these do not limit the orientation of the image display device according to the present disclosure at the time of manufacture or usage. In the following descriptions, for example, an X-plus axis indicates the direction of the arrow of the X-axis and an X-minus axis indicates the direction opposite of the X-plus axis. The same applies to the Y-axis and the Z-axis. Note that the drawings are represented schematically and are not necessarily precise illustrations. Like reference signs indicate like elements in the drawings, and overlapping descriptions thereof are omitted or simplified.

Embodiment

[1. Outline of Configuration of Image Display Device]

Figure 2B:
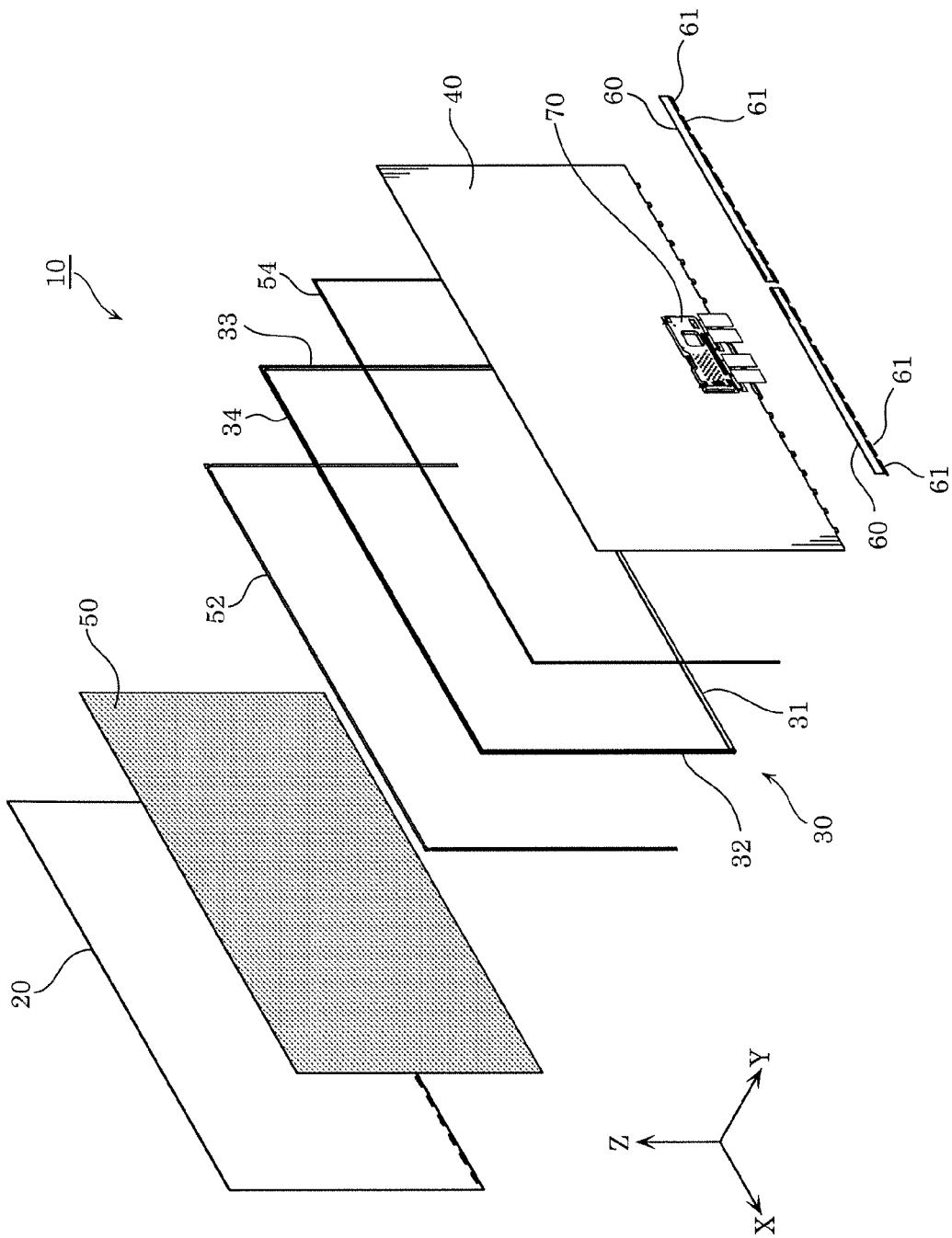
FIG. 2B is a second exploded perspective view of the image display device according to the embodiment.
Figure 3:
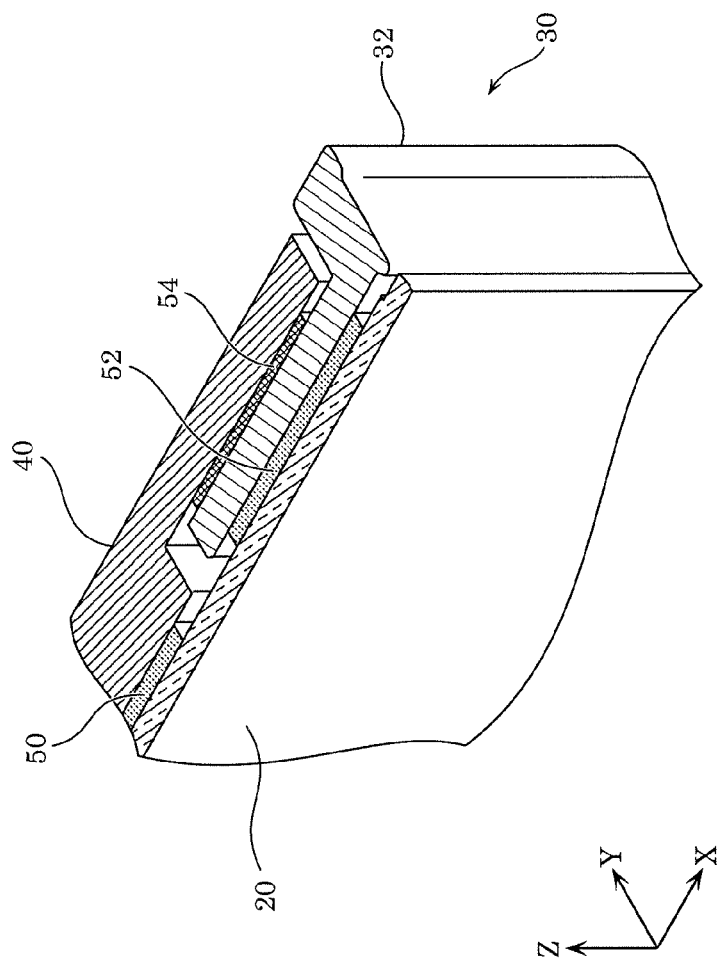
FIG. 3 is a perspective view of a partial cross section of the image display device according to the embodiment.

First, an outline of a configuration of image display device 10 according to an embodiment will be described with reference to FIG. 1 to FIG. 3. FIG. 1 is an external perspective view of image display device 10 according to the embodiment. FIG. 2A is a first exploded perspective view of image display device 10 according to the embodiment. FIG. 2B is a second exploded perspective view of image display device 10 according to the embodiment. Specifically, FIG. 2A is an exploded perspective view of image display device 10 when seen diagonally from the front, and FIG. 2B is an exploded perspective view of image display device 10 when seen diagonally from behind. FIG. 3 is a perspective view of a partial cross section of image display device 10 according to the embodiment. Specifically, FIG. 3 illustrates a portion of a cross section taken along line III-III in FIG. 1 when seen diagonally from the top.

Image display device 10 according to the present embodiment is a display panel module which includes display panel 20. Image display device 10 is, for example, a device incorporated, as a device which displays an image, into a television receiver, a monitor display or another apparatus.

Specifically, as illustrated in FIG. 1 to FIG. 3, image display device 10 includes display panel 20 which displays an image, and back cover 40 disposed along the back surface of display panel 20.

In the present embodiment, display panel 20 is a self-emitting display panel, and specifically is an organic EL panel. In other words, image display device 10 is a display panel module (OLED module) which includes an organic EL panel. Display panel 20 which is an organic EL panel includes, for example, an EL substrate, a glass substrate on which a color filter is formed (CF substrate), a resin layer between the EL substrate and the CF substrate. However, the detailed illustration and description of those elements are omitted.

Back cover 40 is a cover disposed on the back side of image display device 10 as a display panel module. Back cover 40 is a member manufactured by, for example, applying press work to a rectangular metal plate member (metal plate) made of aluminum or iron. In the present embodiment, back cover 40 has a plurality of recesses 41 on the bottom end portion. Each recess 41 is recessed inward (upward) from the edge of the bottom of back cover 40. There are protrusions 42 on the lateral sides of recess 41. The functions and the like of recesses 41 of image display device 10 will be later described with reference to FIG. 4 and FIG. 5.

In the present embodiment, back cover 40 also functions as a heat dissipating member which dissipates heat of display panel 20. Specifically, the back surface of display panel 20 and metal back cover 40 are joined by adhesive sheet 50. Adhesive sheet 50 is a type of so-called double-sided tape in which adhesive is disposed on the both sides of a sheet-like member, for example. In the present embodiment, a double-sided tape having a high thermal conductivity is used as adhesive sheet 50. Moreover, the back surface of display panel 20 and almost the entire portion of back cover 40 above recesses 41 on the bottom end portion of back cover 40 are joined to each other by adhesive sheet 50 having a high thermal conductivity. Accordingly, the heat of display panel 20 can be emitted to the outside efficiently by metal back cover 40.

Back cover 40 may also have design characteristics. For example, back cover 40 may be painted, or a resin or metal thin adhesive sheet or plate may be pasted to back cover 40. In the case where back cover 40 is painted, black paint allows heat to be more efficiently emitted to the outside by dissipation.

Display panel 20 and back cover 40 do not have to be joined by single adhesive sheet 50. Display panel 20 and back cover 40 may be joined by a plurality of adhesive sheets (double-sided tapes) arranged on the XZ plane. These adhesive sheets (double-sided tapes) may be spaced apart from each other.

Image display device 10 according to the present embodiment further includes rectangular ring-shaped support frame 30 which supports display panel 20 and back cover 40, first double-sided tape 52, and second double-sided tape 54.

Support frame 30 is, for example, a member made of metal, such as aluminum. As illustrated in FIG. 2A and FIG. 2B, support frame 30 includes bottom frame 31, right frame 32, left frame 33, and top frame 34. In the present embodiment, these frames are connected to form single rectangular ring-shaped support frame 30.

Support frame 30 does not have to be divided into four frames as above. Support frame 30 may be, for example, manufactured as a member which integrally includes the above four frames. For example, a member which forms the corner portion may be interposed between adjacent frames. The material of support frame 30 is not limited to metal. For example, resin may be used for the material of support frame 30.

First double-sided tape 52 is a member which joins the outer edge of display panel 20 and support frame 30 and second double-sided tape 54 is a member which joins support frame 30 and back cover 40. For example, as illustrated in FIG. 3, right frame 32 of support frame 30 and display panel 20 are joined to each other by first double-sided tape 52, and right frame 32 of support frame 30 and back cover 40 are joined to each other by second double-sided tape 54.

Figure 4:
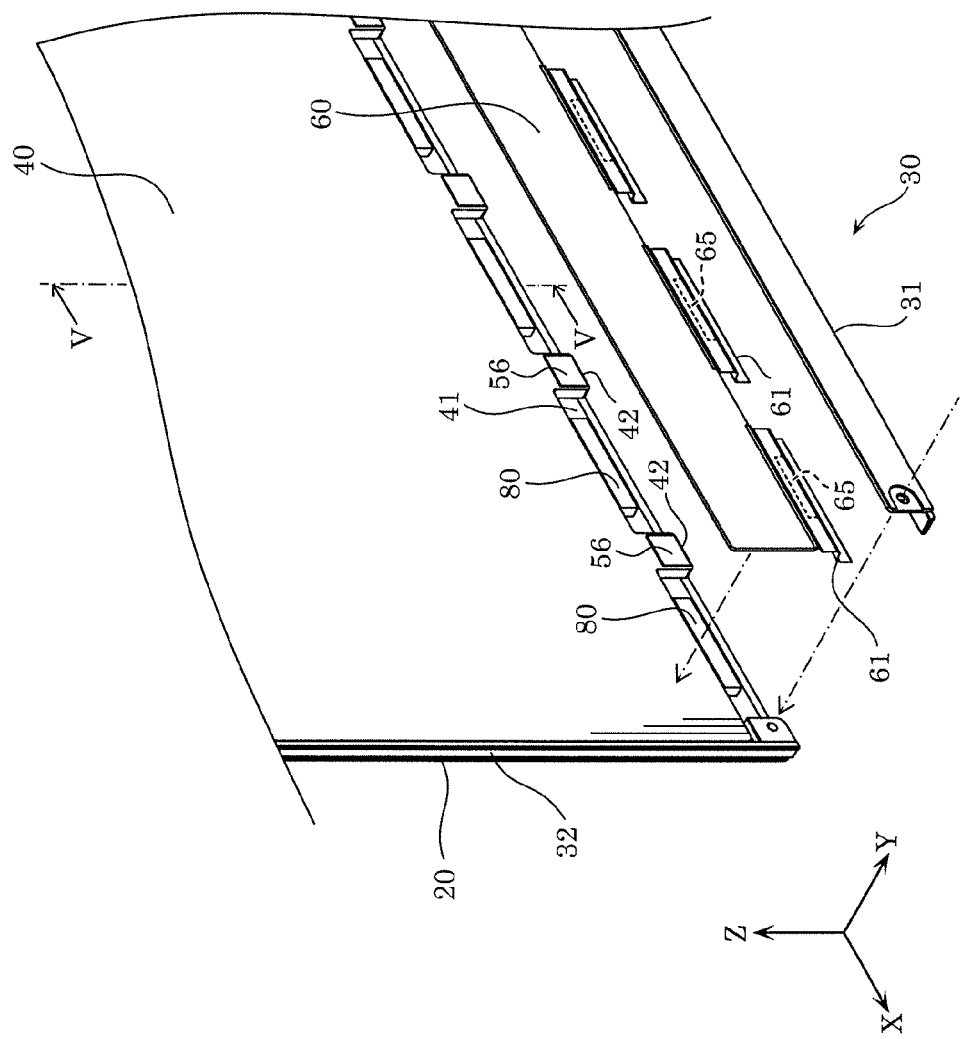
FIG. 4 is an enlarged perspective view of a bottom end portion of the back side of the image display device according to the embodiment.

As illustrated in FIG. 2A and FIG. 2B, image display device 10 thus configured includes two circuit substrates 60, a plurality of FPCs 61, and timing controller 70, as components for driving the display of the image on display panel 20 which is an organic EL panel. Each FPC 61 is an example of a wiring member which connects circuit substrate 60 and display panel 20. Timing controller 70 and two circuit substrates 60 are fixed to the back surface of back cover 40 by, for example, double-sided tapes or screwing into bosses on the back surface of back cover 40. In FIG. 2A, FIG. 2B and FIG. 4 which will be described later, a plurality of circuit components included in circuit substrates 60 are not illustrated.

Timing controller 70 generates various kinds of signals, such as a clock signal for dividing the image data to be displayed on display panel 20 to each pixel of display panel 20, and supplies the signals to circuit substrates 60. Circuit substrates 60 are electronic circuit substrates which transmit, to FPCs 61, the various signals supplied from timing controller 70.

Although FIG. 2A and FIG. 2B illustrate FPCs 61 separately from display panel 20, FPCs 61 are connected to display panel 20 in an assembled state of image display device 10. In other words, display panel 20 and two circuit substrates 60 are connected to each other by a plurality of FPCs 61. Specifically, FPCs 61 are connected to the electrode terminals of various signal lines of display panel 20 by thermal compression bonding using an aeolotropic conductive film, for example.

[2. FPC Peripheral Configuration]

Next, a peripheral configuration of FPC 61 in image display device 10 will be described with reference to FIG. 4 and FIG. 5.

FIG. 4 is a perspective view of the bottom end portion of the back side of image display device 10 according to the embodiment. FIG. 5 is a cross-sectional view of a portion of image display device 10 according to the embodiment where FPC 61 is disposed. Specifically, in FIG. 5, a portion of a cross section taken along V-V in FIG. 4 is simply illustrated, and the lateral sides of FPC 61 and drive IC 65 included in FPC 61 are illustrated rather than the cross section.

In the present embodiment, back cover 40 is disposed along the back surface of display panel 20. Back cover 40 also functions as a heat dissipating plate of display panel 20. Circuit substrate 60 is disposed on the back surface of back cover 40. FPCs 61 connected to the bottom end portion of display panel 20 are connected to circuit substrate 60.

Image display device 10 thus configured is required to have a configuration for accommodating FPCs 61 in image display device 10 so as not to impair the heat dissipating function of back cover 40 as much as possible and not to increase the thickness of image display device 10 as much as possible.

Figure 5:
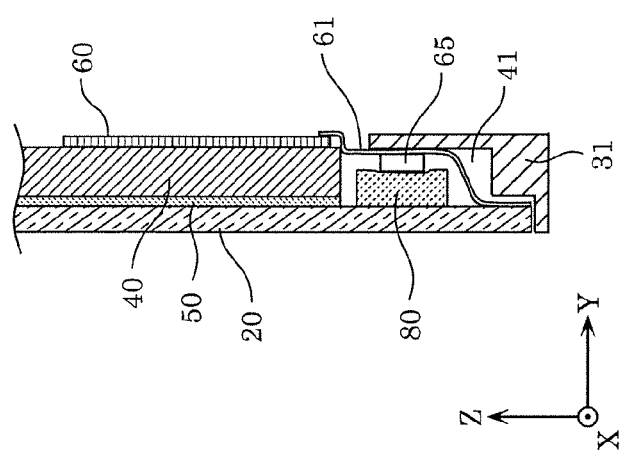
FIG. 5 is a cross-sectional view of a portion of the image display device according to the embodiment where an FPC is disposed.

In view of the above, in the present embodiment, as illustrated in FIG. 4 and FIG. 5, such a configuration is adopted in which recesses 41 are disposed on the bottom end portion of back cover 40 at the positions corresponding to FPCs 61 so that FPCs 61 are accommodated in recesses 41, and protrusions 42 at the lateral sides of recesses 41 dissipate heat of the bottom end portion of display panel 20.

In other words, image display device 10 according to the present embodiment includes: display panel 20 which displays an image; back cover 40 disposed along the back surface of display panel 20; circuit substrate 60 disposed on the back surface of back cover 40 for driving the display of the image on display panel 20; and FPCs 61 which connect circuit substrate 60 and display panel 20. Back cover 40 has recesses 41 recessed inward from the edge of back cover 40 in a plan view. FPCs 61 are disposed so as to pass through recesses 41.

With this configuration, for example, each FPC 61 can be disposed so as to pass through back cover 40 in the thickness direction (Y-axis direction) without disposing FPC 61 extending under the edge of the bottom portion of back cover 40. In other words, in image display device 10, FPC 61 can be accommodated within the width range of back cover 40 in the height direction (Z-axis direction), and within the thickness range of back cover 40. Moreover, back cover 40 has protrusions 42 at the portions which do not correspond to FPCs 61. Hence, protrusions 42 are capable of receiving heat of the bottom end portion of display panel 20 and emitting the heat to the outside.

Moreover, back cover 40 which functions as a heat dissipating plate of display panel 20 is a cover on the back side of image display device 10. In other words, back cover 40 functions as part of the outer shell of image display device 10. In other words, for example, compared with the case where a heat dissipating plate is disposed on the back surface of display panel 20 and a cover which covers display panel 20 and the heat dissipating plate is disposed on the back side of the heat dissipating plate, the thickness of image display device 10 as a display panel module is reduced.

As described above, in the present embodiment, it is possible to accommodate FPCs 61 in recesses 41 disposed on the bottom end portion of back cover 40 disposed along the back surface of display panel 20, and to make protrusions 42 on the lateral sides of recesses 41 receive the heat of the bottom end portion of display panel 20. Accordingly, the temperature degradation of display panel 20 can be suppressed, and the reduced thickness of display panel 20 can be achieved. Hence, image display device 10 according to the present embodiment is capable of increasing the quality of a displayed image and reducing the thickness of image display device 10.

Moreover, drive IC 65 connected to a plurality of signal lines of organic EL panel which is display panel 20 is disposed in each FPC 61. For example, as illustrated in FIG. 5, the portion of FPC 61 where drive IC 65 is disposed is accommodated in recess 41. Drive IC 65 is an example of an electric component included in the wiring member.

In addition, in the present embodiment, bottom frame 31 which is part of support frame 30 is in contact with FPC 61 positioned at the back side of drive IC 65.

In other words, image display device 10 according to the present embodiment includes bottom frame 31 extending along the edge of back cover 40 where recesses 41 are disposed. FPC 61 has a first end connected to display panel 20 and a second end connected to circuit substrate 60, and includes drive IC 65 between the first end and the second end. Bottom frame 31 is thermally connected to drive IC 65.

With such a configuration, drive IC 65 which generates heat at the time of driving of display panel 20 is thermally connected to bottom frame 31 made of metal, such as aluminum. Hence, the heat of drive IC 65 is mainly conducted to bottom frame 31. Accordingly, the temperature degradation of display panel 20 caused by the heat of drive IC 65 is less likely to occur. Additionally, since bottom frame 31 is part of support frame 30 which supports display panel 20 and back cover 40, the heat of drive IC 65 can be dissipated efficiently without, for example, using an additional member for dissipating the heat of drive IC 65.

More specifically, in the present embodiment, as illustrated in FIG. 5, drive IC 65 is pushed backward by heat insulating member 80. In other words, image display device 10 according to the present embodiment includes heat insulating member 80 which is disposed between display panel 20 and bottom frame 31 and which pushes drive IC 65 toward bottom frame 31.

With such a configuration, the heat of drive IC 65 can be efficiently conducted to bottom frame 31, and the heat of drive IC 65 is less likely to be given to display panel 20. As the material of heat insulating member 80, for example, a porous material which is deformable and has an air layer, such as a highly expandable silicone foam or polyurethane foam, is used. Accordingly, heat insulating member 80 is capable of reducing heat conduction from drive IC 65 to display panel 20. In addition, heat insulating member 80 is also capable of functioning as a buffer member which protects drive IC 65 and FPC 61, for example, during the transportation of image display device 10.

Moreover, in the present embodiment, each recess 41 of back cover 40 is disposed between two protrusions 42 aligned in the extension direction of the edge of back cover 40. Each of two protrusions 42 is joined to bottom frame 31 by a joining member. Specifically, as illustrated in FIG. 4, third double-sided tape 56, which is an example of the joining member, is pasted to each protrusion 42. Third double-sided tape 56 joins each protrusion 42 and bottom frame 31.

Accordingly, the effectiveness of the function as a member which supports display panel 20 and back cover 40, which is the function of bottom frame 31 which is part of support frame 30 can be increased. Moreover, while heat insulating member 80 disposed between display panel 20 and bottom frame 31 works so that display panel 20 and bottom frame 31 are separated from each other, third double-sided tape 56 works so that bottom frame 31 does not separate from display panel 20. Hence, for example, the heat dissipating effect provided by bottom frame 31 caused by heat insulating member 80 pushing drive IC 65 is further increased.

Image display device 10 according to the embodiment has been described. In image display device 10, recesses 41 of back cover 40 may have a configuration different from the configuration illustrated in FIG. 3 to FIG. 6. Various variations of recesses 41 will be described below focusing on the differences from the above embodiment.

[3. Variation 1]

Figure 6:
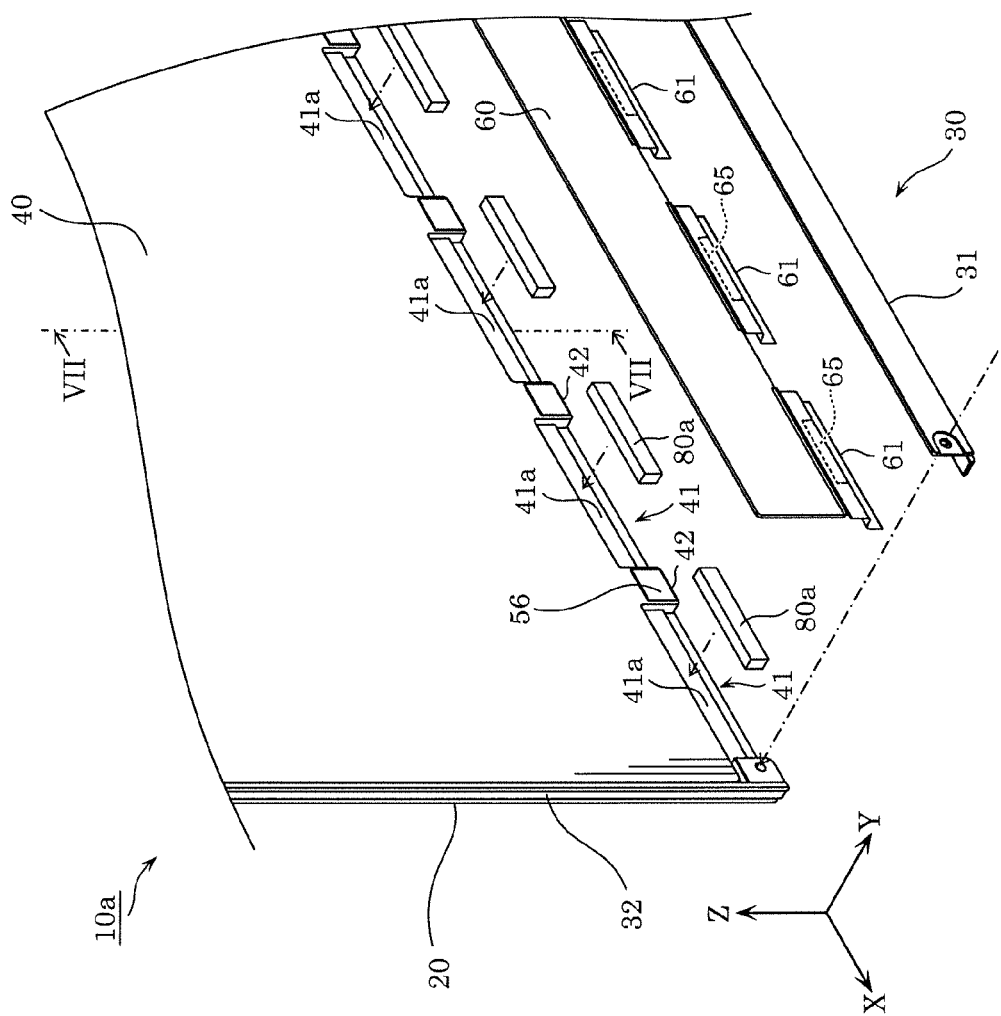
FIG. 6 is an exploded perspective view of an image display device according to Variation 1 of the embodiment.
Figure 7:
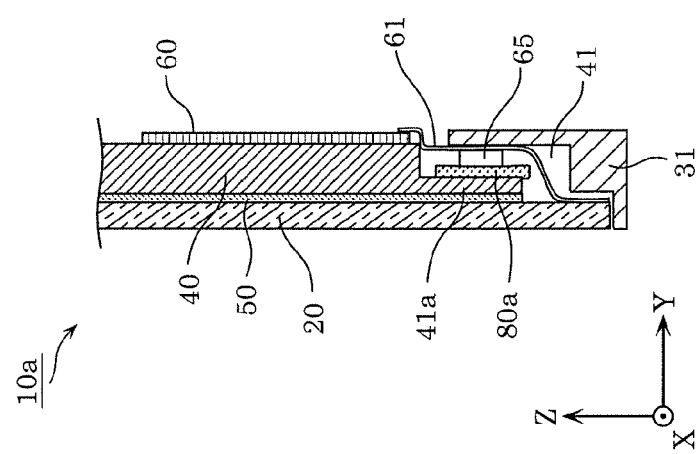
FIG. 7 is a cross-sectional view of a portion of the image display device according to Variation 1 of the embodiment where an FPC is disposed.

FIG. 6 is an exploded perspective view of image display device 10a according to Variation 1 of the embodiment. FIG. 7 is a cross-sectional view of a portion of image display device 10a according to Variation 1 of the embodiment where FPC 61 is disposed. In FIG. 7, a partial cross section taken along VII-VII in FIG. 6 is simply illustrated, and the lateral sides of FPC 61 and drive IC 65 included in FPC 61 are illustrated rather than the cross sections.

As illustrated in FIG. 6 and FIG. 7, back cover 40 included in image display device 10a according to Variation 1 has recesses 41 recessed inward from the edge of back cover 40 in a plan view, in a similar manner to back cover 40 according to the above embodiment. Moreover, each FPC 61 is disposed so as to pass through recess 41. In a portion of each recess 41 according to Variation 1, back cover 40 has thin portion 41a which is thinner than a portion of back cover 40 adjacent to recess 41 (for example, protrusion 42). As illustrated in FIG. 7, drive IC 65 of FPC 61 is disposed between thin portion 41a and bottom frame 31.

In other words, in Variation 1, recess 41 is notched from the edge of the bottom of back cover 40, and has, at the lowermost part, an opening which passes through back cover 40 in the thickness direction (Y-axis direction). Moreover, above the opening, only the back side of the thick portion of back cover 40 has a portion recessed inward (upward) from the edge. As a result, thin portion 41a is formed along the back surface of display panel 20. Heat insulating member 80a is attached to the back side (Y-plus axis side) of thin portion 41a. Heat insulating member 80a is disposed so as to push drive IC 65 toward bottom frame 31.

With this configuration, recesses 41 of back cover 40 allow respective FPCs 61 and drive ICs 65 to be accommodated within the thickness range of back cover 40. Existence of thin portions 41a increases the heat dissipation efficiency. Specifically, for example, in the above embodiment, since heat insulating member 80a is in a direct contact with the back surface of display panel 20, the heat conduction from drive IC 65 to display panel 20 is reduced. However, the heat dissipation efficiency of the contact portion between display panel 20 and heat insulating member 80a is less likely to increase. In this regard, in Variation 1, heat insulating member 80a is disposed so as to push the back surface of display panel 20 via thin portion 41a. Hence, the heat of the portion of the back surface of display panel 20 opposing heat insulating member 80a can be efficiently conducted to thin portion 41a. Moreover, since thin portion 41a functions as a portion which pushes drive IC 65 toward bottom frame 31 via heat insulating member 80a, heat dissipation of drive IC 65 via bottom frame 31 can be performed more efficiently. As described, in image display device 10a according to Variation 1, since back cover 40 has thin portion 41a in each recess 41, heat dissipation of display panel 20 and drive IC 65 can be efficiently performed.

As illustrated in FIG. 7, heat insulating member 80a may be disposed at a position which covers the bottom edge of thin portion 41a. This prevents interference of FPC 61 and the bottom edge of thin portion 41a positioned relatively close to FPC 61. In other words, heat insulating member 80a is capable of functioning as a buffer member which protects drive IC 65 and FPC 61, for example, during transportation of image display device 10a.

[4. Variation 2]

Figure 8:
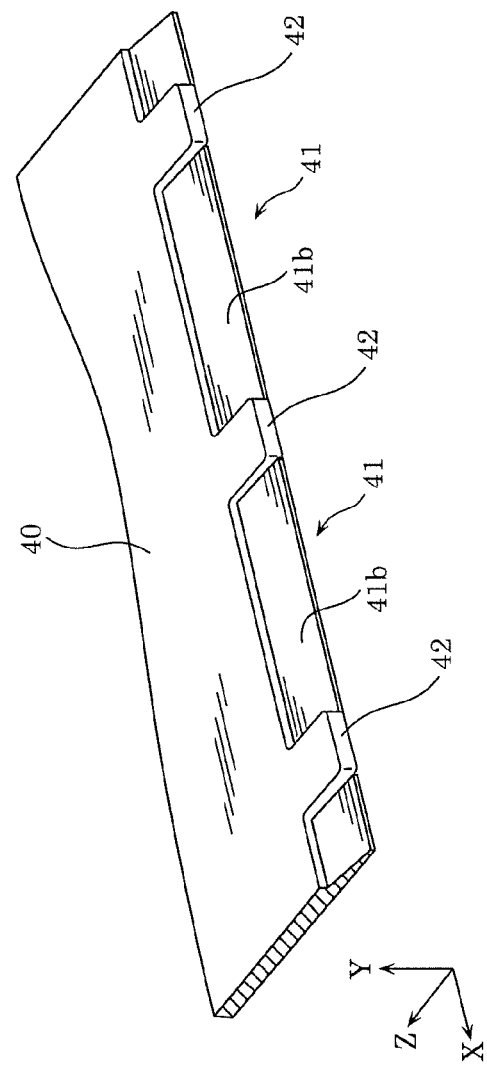
FIG. 8 is a perspective view of recesses and thin portions according to Variation 2 of the embodiment.
Figure 9:
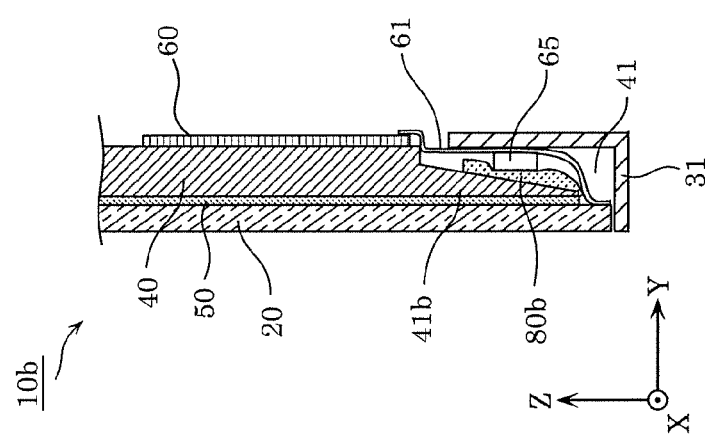
FIG. 9 is a cross-sectional view of a portion of an image display device according to Variation 2 of the embodiment where an FPC is disposed.

FIG. 8 is a perspective view of recesses 41 and thin portions 41b according to Variation 2 of the embodiment. FIG. 9 is a cross-sectional view of a portion of image display device 10b according to Variation 2 of the embodiment where FPC 61 is disposed.

As illustrated in FIG. 8 and FIG. 9, back cover 40 included in image display device 10b according to Variation 2 has recesses 41. In Variation 2, back cover 40 has thin portion 41b in each recess 41 in a similar manner to recesses 41 according to Variation 1. However, in Variation 2, thin portion 41b is formed in the entire region of recess 41 in a plan view (when seen from the Y-axis direction). As illustrated in FIG. 9, drive IC 65 is disposed between thin portion 41b and bottom frame 31.

In other words, in Variation 2, each recess 41 does not substantially have a portion which passes through back cover 40 in the thickness direction (Y-axis direction). Only the back side of the thick portion of back cover 40 has a portion recessed inward (upward) from the edge of back cover 40. As a result, thin portion 41b is formed along the back surface of display panel 20 in the entire region of recess 41. In this case, too, each recess 41 of back cover 40 allows FPC 61 and drive IC 65 to be accommodated within the thickness range of back cover 40. In addition, existence of thin portion 41b increases the heat dissipation efficiency. In other words, since heat insulating member 80b is disposed so as to push the back surface of display panel 20 via thin portion 41b, the heat of the portion of the back surface of display panel 20 opposing heat insulating member 80b is efficiently conducted to thin portion 41b. Moreover, since thin portion 41b functions as a portion which pushes drive IC 65 toward bottom frame 31 via heat insulating member 80b, heat dissipation of drive IC 65 via bottom frame 31 can be performed more efficiently. As described, in image display device 10b according to Variation 2, since back cover 40 has thin portion 41b in each recess 41, heat dissipation of display panel 20 and drive ICs 65 can be efficiently performed.

Moreover, in Variation 2, as illustrated in FIG. 9, the entire portion of thin portion 41b including an end portion closer to the edge of back cover 40 (on the Z-minus axis side) has a thickness which decreases as the thin portion gets closer to the edge. With this, for example, the pushing force of thin portion 41b toward drive IC 65 can be secured, while forming a space for appropriately accommodating FPC 61 and drive IC 65 on the back side of thin portion 41b. Moreover, compared with the case where the entire region of thin portion 41b is thin, the amount of heat extraction by thin portion 41b increases.

Note that the entire region of thin portion 41b does not have to have an inclined surface as illustrated in FIG. 9. For example, only a portion of thin portion 41b including an end portion closer to the edge of back cover 40 may have a thickness which decreases as the thin portion gets closer to the edge. In other words, by reducing the thickness of the tip portion of thin portion 41b compared with the other portions, the clearance between the tip portion and bottom frame 31 in the front and back direction (Y-axis direction) can be increased. As a result, FPC 61 extending from display panel 20 and deflected can be accommodated between the tip portion of thin portion 41b and bottom frame 31 naturally. Moreover, in this case, by making the back surface of thin portion 41b above the tip portion parallel to the front surface of thin portion 41b (making it not inclined), the pushing force toward drive IC 65 caused by sandwiching drive IC 65 between bottom frame 31 and thin portion 41b is equalized. Accordingly, for example, degradation or positional deviation of drive IC 65 caused by a large force being applied partially to drive IC 65 can be reduced.

In Variation 2, too, as illustrated in FIG. 9, heat insulating member 80b may be disposed at a position which covers the bottom edge of thin portion 41b. Accordingly, heat insulating member 80b is capable of functioning as a buffer member which protects drive IC 65 and FPC 61, for example, during transportation of image display device 10b. Additionally, as in Variation 1, in the case where a thin portion is disposed only in a portion of each recess 41, an inclined surface as illustrated in FIG. 9 may be formed in at least a portion of the thin portion.

OTHER EMBODIMENTS

As described above, the embodiment has been described as an example of the technique disclosed in the present application. The technique in the present disclosure, however, is not limited to such an example, and is also applicable to embodiments to which various kinds of modifications, replacements, additions, deletions and the like have appropriately been made. Moreover, each structural element described in the above embodiment may be combined to obtain a new embodiment. Another embodiment will be described below as an example.

For example, in the embodiment above, FPCs 61 are connected to the bottom end portion of display panel 20, and back cover 40 has recesses 41 on the bottom end portion of back cover 40. However, for example, in the case where FPCs 61 are connected to the left end portion of display panel 20, back cover 40 may have recesses 41 on the left end portion of back cover 40. In other words, recesses 41 of back cover 40 may be positioned so as to correspond to the positions where FPCs 61 are connected to display panel 20. In this case, by disposing heat insulating member 80 at the position opposite to each drive IC 65, heat insulating member 80 is capable of pushing drive IC 65 toward left frame 33. Accordingly, left frame 33 is capable of more efficiently emitting the heat of drive IC 65 to the outside.

Moreover, the joining member which joins display panel 20 and back cover 40 does not have to be a member which uses an adhesive, such as a double-sided tape. For example, display panel 20 and back cover 40 may be joined by a silicone adhesive with a high thermal conductivity. This also applies to first double-sided tape 52, second double-sided tape 54, and third double-sided tape 56. In place of these double-sided tapes, an adhesive such as a silicone adhesive may be used.

Moreover, display panel 20 and back cover 40 do not have to be joined by an adhesive or the like. For example, by using a member which sandwiches the peripheral portions of layered display panel 20 and back cover 40 from front and back, back cover 40 may be disposed along the back surface of display panel 20.

The wiring member which connects display panel 20 and circuit substrate 60 may be a member other than FPC 61. For example, a rigid flexible substrate which is a substrate in which only a portion can be flexed or curved may be used as the wiring member. Moreover, the electronic component included in the wiring member, such as FPC 61, may be other than drive IC 65. In other words, when an electronic component included in the wiring member generates heat when driven, for example, it is significant to cause part of support frame 30, such as bottom frame 31, to efficiently perform heat dissipation.

Display panel 20 may be a different kind of display panel from an organic EL panel. For example, a light emitting diode (LED) display panel including three kinds of LEDs which emit red, blue, and green light, arranged in a matrix may be disposed in image display device 10 as display panel 20.

As described above, embodiments have been described as examples of the technique disclosed in the present disclosure. For this purpose, the accompanying drawings and detailed description are provided.

Accordingly, the structural elements described in the accompanying drawings and detailed description may include not only structural elements which are essential for solving the problem but also structural elements which are not essential for solving the problem but are provided for illustrating the technique. Therefore, the non-essential structural elements described in the attached drawings and/or the detailed description should not be instantly acknowledged to be essential structural elements.

Since the above embodiments are intended to illustrate the technique in the present disclosure, it is possible to make various kinds of modifications, replacements, additions, deletions, and the like within the scope of the claims or an equivalent scope thereof.

INDUSTRIAL APPLICABILITY

The present disclosure is applicable to an image display device included in, for example, a television receiver, a monitor display, or a digital signage.

The invention claimed is:

1. An image display device, comprising:
    a display panel which displays an image;
    a back cover disposed along a back surface of the display panel, the back cover having a front surface and a back surface opposite to the front surface, the front surface of the back cover facing the back surface of the display panel, the back cover having a recess which is recessed inward from an edge of the back cover in a plan view;
    a circuit substrate disposed on and attached to the back surface of the back cover, the circuit substrate being for driving a display of the image on the display panel;
    a wiring member which is attached to the back surface of the display panel and connects the circuit substrate and the display panels;
    a frame extending along the edge of the back cover where the recess is disposed; and
    a driver circuit disposed on the wiring member, wherein:
    the wiring member is disposed so as to pass through the recess from a back surface side to a front surface side of the back cover,
    the wiring member is disposed between the driver circuit and the frame,
    the wiring member has a first end electronically connected to the display panel and a second end electronically connected to the circuit substrate, and includes an electronic component between the first end and the second end, and
    a heat insulating member is disposed between the display panel and the frame, the heat insulating member pushing the electronic component toward the frame.

2. The image display device according to claim 1, the frame is thermally connected to the electronic component.

3. The image display device according to claim 2, wherein the recess of the back cover is disposed between two protrusions aligned along an extension direction of the edge, and each of the two protrusions is joined to the frame by a joining member.

4. The image display device according to claim 2, wherein the back cover has a thin portion in at least a portion of the recess, the thin portion being thinner than a portion of the back cover adjacent to the recess, and the electronic component is disposed between the thin portion and the frame.

5. The image display device according to claim 4, wherein at least a portion of the thin portion has a thickness which decreases as the thin portion gets closer to the edge of the back cover, the at least the portion of the thin portion including an end portion closer to the edge.

6. The image display device according to claim 1, wherein the display panel is a self-emitting display panel.

7. The image display device according to claim 6, wherein the display pane is an organic electroluminescent display panel.

8. The image display device according to claim 1, wherein the recess is recessed inward from the edge of the back cover in a plan view along a direction parallel to the front or the back surfaces of the back cover.

9. The image display device according to claim 1, wherein the frame is made of metal.

10. The image display device according to claim 1, further comprising a heat insulating member disposed between the driver circuit and the back surface of the display panel.

11. The image display device according to claim 1, wherein:
    the back cover includes protrusions on both sides of the recess, and
    the frame is attached to the protrusions.

12. An image display device, comprising:
    a display panel which displays an image;
    a back cover disposed along a back surface of the display panel, the back cover having a recess which is recessed inward from an edge of the back cover in a plan view;
    a circuit substrate disposed on a back surface of the back cover, the circuit substrate being for driving a display of the image on the display panel;
    a wiring member which connects the circuit substrate and the display panel; and
    a frame extending along the edge of the back cover where the recess is disposed, wherein:
    the wiring member is disposed so as to pass through the recess,
    the wiring member has a first end electronically connected to the display panel and a second end electronically connected to the circuit substrate, and includes an electronic component between the first end and the second end, and the frame is thermally connected to the electronic component, and
    the recess of the back cover is disposed between two protrusions aligned along an extension direction of the edge, and each of the two protrusions is joined to the frame by a joining member, and
    the back cover has a thin portion in at least a portion of the recess, the thin portion being thinner than a portion of the back cover adjacent to the recess and the thin portion has a thickness which decreases as the thin portion gets closer to the edge of the back cover, and a heat insulating member disposed between the display panel and the frame, the heat insulating member pushing the electronic component toward the frame.

* * * * *